United States Patent [19]

Boehnke et al.

[11] Patent Number: 5,240,550
[45] Date of Patent: Aug. 31, 1993

[54] METHOD OF FORMING AT LEAST ONE GROOVE IN A SUBSTRATE LAYER

[75] Inventors: Ralf-Dieter Boehnke, Hamburg; Hans Dammann, Tangstedt; Gert Rabe, Pinneberg, all of Fed. Rep. of Germany

[73] Assignee: U.S. Philips Corp., New York, N.Y.

[21] Appl. No.: 757,379

[22] Filed: Sep. 10, 1991

[30] Foreign Application Priority Data

Sep. 21, 1990 [DE] Fed. Rep. of Germany ....... 4029912

[51] Int. Cl.$^5$ .................. B44C 1/22; C03C 15/00; C03C 25/06
[52] U.S. Cl. ..................... 156/626; 156/643; 156/657; 156/659.1; 156/651
[58] Field of Search ...... 156/643, 657, 659.1, 156/626, 651, 652, 653, 667; 204/192.32, 192.33, 192.37

[56] References Cited

U.S. PATENT DOCUMENTS

| 4,484,979 | 11/1984 | Stocker ............ 156/653 X |
| 4,544,443 | 10/1985 | Ohta et al. ......... 156/663 X |
| 4,632,898 | 12/1986 | Fister et al. ........ 156/652 X |
| 4,655,876 | 4/1987 | Kawai et al. ....... 156/663 X |

FOREIGN PATENT DOCUMENTS

0314522 5/1989 European Pat. Off.
0424110 4/1991 European Pat. Off.

OTHER PUBLICATIONS

M. Sternheim et al, Journal of Electrochemical Society, Solid-State Science and Technology, 1983, pp. 655-659.

K. Knop et al, Journal of Applied Phys. 50 (6) 1979, pp. 3841-3848.

Journal of Applied Physics, Sep. 1989 "A Simple Process to Generate Deeply Modulated and Large Dimension Submicron Gratings on Reflecting Surfaces" Dong Chi et al.

Patent Abstracts of Japan, vol. 11, No. 77 Corresponding to JP 61 232 620.

*Primary Examiner*—William A. Powell
*Attorney, Agent, or Firm*—Ernestine C. Bartlett

[57] ABSTRACT

A groove is formed in a substrate layer by ion etching. The substrate layer comprises a top layer having an etch rate S1 and a bottom layer having a different etch rate S2, in which first, grooves are formed having an initial depth which differs from the desired depth, after which the etching process is carried out without using a mask until the desired depth of the groove is attained.

17 Claims, 1 Drawing Sheet

METHOD OF FORMING AT LEAST ONE GROOVE IN A SUBSTRATE LAYER

FIELD OF THE INVENTION

The invention relates to a method of forming a groove in a substrate layer by means of ion etching.

BACKGROUND OF THE INVENTION

Such a method is described in J. Electrochem. Soc., Solid-State Science and Technology 1983, pp. 665 to 659. Grooves must be formed in the manufacture of, for example, integrated circuits or for digital optical gratings. The etched depth must be monitored and measured. A device which is very suitable for this purpose is a laser interferometer shown in FIG. 3 of the above-mentioned paper.

In particular for the manufacture of the grooves of high-quality digital optical phase gratings (see J. Appl. Phys. 50 (6) 1979, pp. 3841 to 3848) the desired depth of the grooves must be etched with an accuracy of approximately ±0.25%.

Up to now an etch mask was photolithographically provided on a homogeneous $SiO_2$ substrate layer, which mask does not cover the areas of the substrate layer where grooves are to be etched. Subsequently, an etching gas (for example $CHF_3$) was used to etch the grooves, the total depth of the grooves, i.e., from the surface of the masking layer to the bottom surface of the grooves, being monitored by means of a laser interferometer. In this method the really essential value of the desired depth of the grooves formed in the substrate layer could not be determined directly but instead a value is provided in which the residual thickness of the masking layer is included. If the etch rate of the substrate material and the etch rate of the masking material, which is generally substantially lower than that of the substrate material, are known, the etch depth in the substrate layer can be calculated from the total depth of the groove being formed. Unfortunately, however, the measuring inaccuracy is higher than 5% because the materials of the mask and the substrate may have a different ratio of the etch rates which is governed by, inter alia process parameters.

SUMMARY OF THE INVENTION

It is an object of the invention to provide a method of the type described in the opening paragraph, which method enables a groove of a desired depth to be etched with a relatively high accuracy.

This object is achieved in that a substrate layer is used which comprises a top layer having an etch rate S1 and a bottom layer having a different etch rate S2, and in that, first, grooves are formed having an initial depth which differs from the desired depth, after which the etching operation is carried out without using a mask until the desired depth of the groove is attained.

When the etch rate of the top layer is higher than that of the bottom layer, the initial depth of the groove must be greater than the desired depth, and conversely.

Thus, the method according to the invention permits, in particular, to directly and very accurately measure the depth of the groove etched in the substrate layer by using a particularly suitable laser interferometer.

The top layer can be provided in the form of strips forming groove walls by means of sputtering. More accurate groove walls are obtained, however, by sputtering the top layer onto the entire surface area of the bottom layer, after which a mask is provided so that the areas of the grooves are left free and the grooves are etched to the initial depth, subsequently, the mask is removed and the etching operation is continued until the desired depth of the groove is attained.

In particular for the manufacture of digital optical phase gratings, the bottom layer preferably consists of a $SiO_2$ solid body manufactured in a melting process and the top layer preferably consists of $SiO_2$ which is provided by sputtering. It has been found, that the $SiO_2$ layers manufactured according to different methods exhibit clearly (approximately 5%) different etch rates, but that they have the same refractive indices so that the double-layer substrate material is optically uniform.

The invention will be explained in greater detail by means of an advantageous exemplary embodiment.

DESCRIPTION OF THE PREFERRED EMBODIMENT

Figure 1:
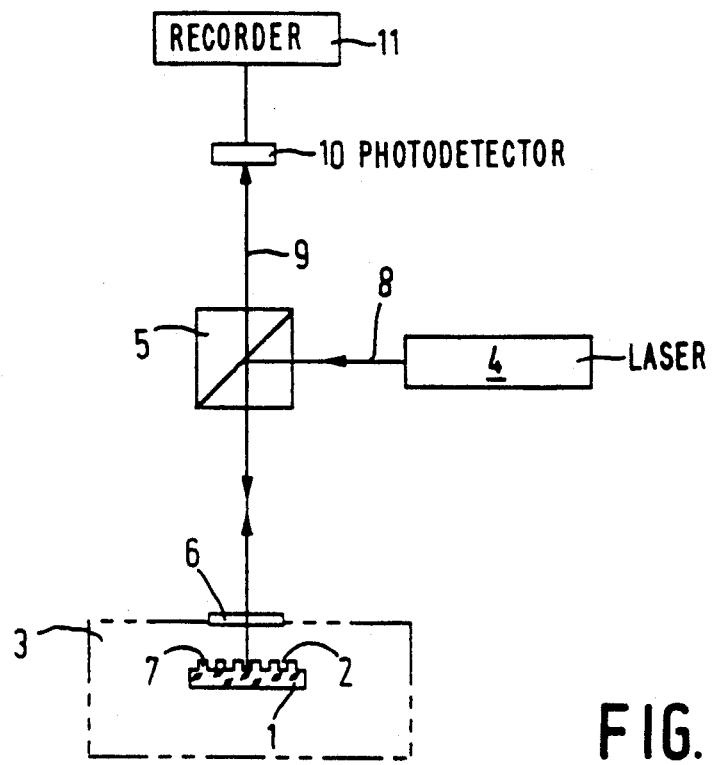
FIG. 1 diagrammatically shows an arrangement for carrying out the method according to an embodiment of the invention.

In FIG. 1, a digital optical phase grating 1 having grooves 2 is situated in an ion-etching device 3, the groove depth being measurable by means of a laser interferometer indicated above the ion-etching device 3. Such devices are known and described in, for example, the above-mentioned paper in J. Appl. Phys.

A light beam 8 emitted by a laser 4 passes from a beam splitter 5 through a vacuum window 6 onto the surface of a phase grating 1 to be manufactured. Radiation components reflecting from the bottom surfaces of the grooves 2 and from the surfaces of the raised portions, and exhibiting a phase difference, pass through the beam splitter 5 and reach the photodetector 10 as a reunited beam 9, the output signal of which photodetector varies periodically as a function of the etch depth of the grooves 2. In this connection, a period of a change of the etch depth corresponds to approximately $\lambda/2$, where $\lambda$ is the wavelength of the laser light.

The output signal of the photodetector 10 is recorded as a function of time by means of a recorder 11. In this manner, the total depth of the grooves 2 can be measured. However, when the height of the raised portion 7 also includes layer thicknesses of a mask which is to be removed at a later stage, the actual etch depth in the substrate layer of the digital optical grating 1 can only be determined indirectly from the not exactly known ratio of the etch rates between the materials of the mask and the substrate.

Figure 2:
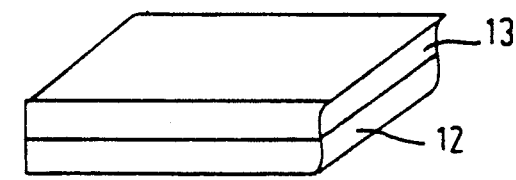
FIG. 2 shows a substrate layer which is suitable for one embodiment of the invention.

In accordance with the invention, the substrate layer of FIG. 2 consists of an approximately 1 mm thick solid bottom layer 12 (base substrate) of $SiO_2$ on which an approximately 1.5 μm thick top layer 13 of $SiO_2$ is provided by sputtering. Other transparent substances such as, for example, $Al_2O_3$ can alternatively be used for the bottom layer and the top layer 13. The layers may also consist of different substances. It is essential, however, that the etch rates of the materials used for both layers are different. The etch rate of the SiO$_2$ base substrate is S$_2$=31.7 mm/min, the etch rate of the sputtered SiO$_2$ top layer is S$_1$=33.2 mm/min, both values being measured at an equal predetermined pressure.

Figure 3:
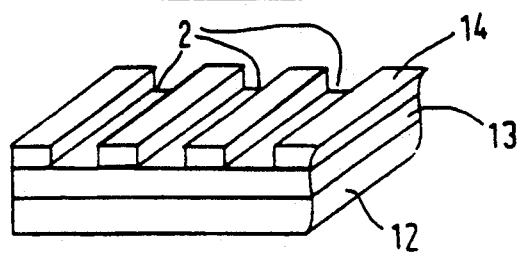
FIG. 3 shows the substrate layers of FIG. 2 on which an etch mask has been provided.
Figure 4:
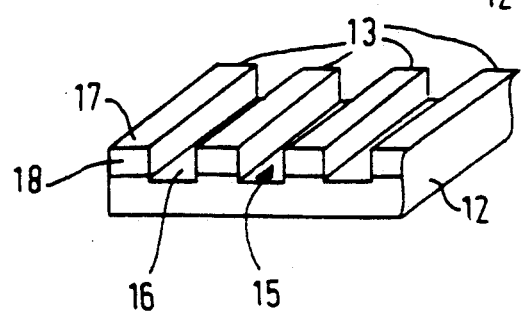
FIG. 4 shows the arrangement of FIG. 3 after the etching of the grooves to an initial depth.

As shown in FIG. 3, masking strips 14 of a photoresist (etch rate 16.0 mm/min) are provided on the substrate layer shown in FIG. 2. Subsequently, a device as shown in FIG. 1 is used to etch grooves 2 between the masking strips 14, the grooves having a depth such that the etched depth in the substrate layer shown in FIG. 2 exceeds the required depth. Subsequently, residues of the masking strips 14 are removed so that a structure as shown in FIG. 4 is obtained.

The channels 15 extend through the top layer 13 and slightly penetrate the bottom layer 12. The depth of the channel 15 is optically determined in known manner with an accuracy of approximately 1 mm. As the etch rates of the bottom surfaces 16 are lower than the etch rates of the surfaces 17 of the ridges 18, the depth of the channels 15 which is in excess of the desired depth is reduced to conform to the desired depth in a further etching process using the device of FIG. 1.

What is claimed is:

1. A method for accurately forming at least one groove of a desired depth in a substrate layer by ion etching, which comprises providing a substrate layer which comprises a top layer having an etch rate S1 and a bottom layer having a different etch rate S2, and, first, forming at least one groove in the substrate having an initial depth which differs from the desired depth, and thereafter etching the substrate without using a mask until the desired depth of the at least one groove is attained.

2. A method of forming at least one groove in a substrate layer by ion etching which comprises providing a substrate layer which comprises a top layer having an etch rate S1 and a bottom layer having a different etch rate S2, and, first, forming at least one groove in the substrate having an initial depth which differs from the desired depth, and after said forming, etching the substrate without using a mask until the desired depth of the at least one groove is attained, the depth of the at least one groove in the etching process being measured by a laser interferometer.

3. A method of forming at least one groove in a substrate layer by ion etching which comprises providing a substrate layer which comprises a top layer having an etch rate S1 and a bottom layer having a different etch rate S2, and, first, forming at least one groove in the substrate having an initial depth which differs from the desired depth, and after said forming, etching the substrate without using a mask until the desired depth of the at least one groove is attained, the top layer being provided on the bottom layer by cathode sputtering.

4. A method as claimed in claim 3 including providing the top layer in the form of strips which constitute groove walls by sputtering.

5. A method as claimed in claim 3 including sputtering the top layer onto the entire surface area of the bottom layer, after which providing a mask so that the areas of the grooves are left free and the grooves are etched to an initial depth, subsequently, removing the mask and continuing the etching until the desired depth of the grooves is attained.

6. A method as claimed in claim 5 wherein the etch rate of the top layer exceeds the etch rate of the bottom layer and the initial depth exceeds the desired depth.

7. A method as claimed in claim 6 wherein the bottom layer consists of a SiO$_2$ solid body formed by melting, and the top layer consists of sputtered SiO$_2$.

8. A method as claimed in claim 1 including forming a plurality of mutually parallel grooves in the substrate layer to form a digital optical phase grating.

9. A method as claimed in claim 2 including providing the top layer on the bottom layer by cathode sputtering.

10. A method as claimed in claim 9 including providing the top layer in the form of strips which constitute groove walls by sputtering.

11. A method as claimed in claim 9 including sputtering the top layer onto the entire surface area of the bottom layer, after which providing a mask so that the areas of the grooves are left free and the grooves are etched to an initial depth, subsequently, removing the mask and continuing the etching until the desired depth of the groove is attained.

12. A method as claimed in claim 11 wherein the etch rate of the top layer exceeds the etch rate of the bottom layer and the initial depth exceeds the desired depth.

13. A method as claimed in claim 12 wherein the bottom layer consists of a SiO$_2$ solid body formed by melting, and the top layer consists of sputtered SiO$_2$.

14. A method as claimed in claim 9 including forming a plurality of mutually parallel grooves in the substrate layer to form a digital optical phase grating.

15. A method as claimed in claim 10 including forming a plurality of mutually parallel grooves in the substrate layer to form a digital optical phase grating.

16. A method as claimed in claim 12 including forming a plurality of mutually parallel grooves in the substrate layer to form a digital optical phase grating.

17. A method as claimed in claim 13 including forming a plurality of mutually parallel grooves in the substrate layer to form a digital optical phase grating.

* * * * *